(12) United States Patent
Fukuda et al.

(10) Patent No.: US 8,098,527 B2
(45) Date of Patent: Jan. 17, 2012

(54) SEMICONDUCTOR MEMORY DEVICE AND MANUFACTURING METHOD THEREOF

(75) Inventors: Koichi Fukuda, Yokohama (JP); Dai Nakamura, Kawasaki-ken (JP); Yasuhiko Matsunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 136 days.

(21) Appl. No.: 12/649,822

(22) Filed: Dec. 30, 2009

(65) Prior Publication Data

US 2010/0176422 A1 Jul. 15, 2010

(30) Foreign Application Priority Data

Jan. 14, 2009 (JP) ................. 2009-005778

(51) Int. Cl.
*G11C 11/34* (2006.01)
(52) U.S. Cl. ........ 365/185.23; 365/185.18; 257/E21.69; 257/316
(58) Field of Classification Search ............... 257/E21.69
See application file for complete search history.

(56) References Cited

U.S. PATENT DOCUMENTS

| 7,145,199 B2 | 12/2006 | Kajimoto et al. | |
| 7,339,227 B2 | 3/2008 | Kajimoto et al. | |
| 7,560,766 B2 | 7/2009 | Kajimoto et al. | |
| 7,590,004 B2 | 9/2009 | Abe et al. | |
| 2005/0083744 A1* | 4/2005 | Arai et al. | 365/202 |
| 2006/0198196 A1* | 9/2006 | Abe et al. | 365/185.18 |
| 2007/0138576 A1* | 6/2007 | Mizukami et al. | 257/390 |
| 2008/0232183 A1* | 9/2008 | Maejima et al. | 365/205 |

FOREIGN PATENT DOCUMENTS

| JP | 2005-142493 | 6/2005 |
| JP | 2006-245547 | 9/2006 |

OTHER PUBLICATIONS

Shinya Ito et al., "Limitation of Post-Metallization Annealing Due to Hydrogen Blocking Effect of Multilevel Interconnect", 18.4, 1998 Symposium on VLSI Technology Digest of Technical Papers, pp. 182-183.
Kazushige Kanda et al., "A 120mm$^2$ 16Gb 4-MLC NAND Flash Memory with 43nm CMOS Technology", ISSCC 2008/SESSION 23/ Non-Volatile Memory/23.6, 2008 IEEE International Solid-State Circuits Conference, 3 pages.

* cited by examiner

*Primary Examiner* — Michael Lebentritt
*Assistant Examiner* — Daniel Whalen
(74) *Attorney, Agent, or Firm* — Oblon, Spivak, McClelland, Maier & Neustadt, L.L.P.

(57) ABSTRACT

A semiconductor memory device includes a semiconductor substrate; a memory cell array on the semiconductor substrate, the memory cell array comprising a plurality of memory cells capable of electrically storing data; a sense amplifier configured to detect the data stored in at least one of the memory cells; a cell source driver electrically connected to source side terminals of the memory cells and configured to supply a source potential to at least one of the source side terminals of the memory cells; a first wiring configured to electrically connect between at least one of the source side terminals of the memory cells and the cell source driver; and a second wiring formed in a same wiring layer as the first wiring, the second wiring being insulated from the first wiring and being electrically connected to the sense amplifier, wherein the first wiring and the second wiring have a plurality of through holes provided at a predetermined interval.

21 Claims, 11 Drawing Sheets

SEMICONDUCTOR MEMORY DEVICE AND MANUFACTURING METHOD THEREOF

CROSS-REFERENCE TO RELATED APPLICATION

This application is based upon and claims the benefit of priority from the prior Japanese Patent Applications No. 2009-5778, filed on Jan. 14, 2009, the entire contents of which are incorporated herein by reference.

BACKGROUND OF THE INVENTION

1. Field of the Invention

The present invention relates to a semiconductor memory device and a manufacturing method of the semiconductor memory device.

2. Related Art

Data reading from a NAND flash memory is performed in a page unit. One page includes 4 k-bit to 64 k-bit data, for example. Therefore, in read operation, data of 4,000 to 64,000 memory cells are read simultaneously. Because cell current flows simultaneously to the 4,000 to 64,000 memory cells at this time, potentials of cell source lines sometimes increase (or is lifted). When the potentials of the cell source lines increase, cell current decreases. Consequently, a threshold voltage of the memory cells increases, and a distribution of the threshold voltage of the memory cells is spread. To suppress the spreading of the threshold voltage distribution, the cell source lines connecting between source drivers and sources of the memory cells preferably have as low resistance as possible. For this purpose, a top-layer wiring layer of low resistance in a multilayer wiring structure on a memory cell array can be used as cell source lines and cell well lines (see Japanese Patent Application Laid-open No. 2005-142493 and Japanese Patent Application Laid-open No. 2006-245547).

In recent years, to improve performance of memories, the ABL (All Bit Line) sense scheme has come to be used frequently. In the ABL sense scheme, sense amplifiers are provided corresponding to all bit lines and all bit lines are simultaneously read. Therefore, a large amount of current is consumed in the sense amplifiers. To supply power to the sense amplifiers, wide power source lines need to be arranged from a pad to the sense amplifiers. This increases chip size.

To further downscale the chip size, there is considered a layout of forming on the top-layer wiring layer of the memory cell array a VSS (ground potential) power source lines to be connected to the sense amplifiers, as well as the cell source lines and the cell well lines (see Kanda et al. "A 120 mm² 16 Gb 4-MLC NAND Flash Memory with 43 nm CMOS Technology" ISSCC 2008/SESSION 23/NON-VOLATILE MEMORY/23.6 p.p. 430, 431 and 625). To decrease resistance of the wiring formed on the top-layer wiring layer in this way, an installation area of each wiring is preferably increased. To increase each wiring area of the cell source lines, the cell well lines, and power source lines as far as possible, each wiring formed on the top-layer wiring layer can cover a whole upper part of the memory cell array. However, when the wiring covers the whole upper part of the memory cell array, hydrogen is not thoroughly supplied to the memory cells in a forming gas/anneal process performed at a final stage of a memory-chip manufacturing process. This becomes a cause of degradation of a data holding characteristic of the memory cells.

SUMMARY OF THE INVENTION

A semiconductor memory device according to an embodiment of the present invention comprises: a semiconductor substrate; a memory cell array on the semiconductor substrate, the memory cell array comprising a plurality of memory cells capable of electrically storing data; a sense amplifier configured to detect the data stored in at least one of the memory cells; a cell source driver electrically connected to source side terminals of the memory cells and configured to supply a source potential to at least one of the source side terminals of the memory cells; a first wiring configured to electrically connect between at least one of the source side terminals of the memory cells and the cell source driver; and a second wiring formed in a same wiring layer as the first wiring, the second wiring being insulated from the first wiring and being electrically connected to the sense amplifier, wherein the first wiring and the second wiring have a plurality of through holes provided at a predetermined interval.

A manufacturing method of a semiconductor memory device according to an embodiment of the present invention, comprises: forming a plurality of memory cells, a sense amplifier and a cell source driver on a semiconductor substrate, the memory cells being capable of electrically storing data, the sense amplifier detecting the data stored in at least one of the memory cells, and the cell source driver being electrically connected to a source side terminal of the memory cells; depositing an interlayer dielectric film to cover the memory cells; forming a plurality of contacts connected to the sense amplifier, the source driver and the source side terminals of the memory cells, respectively, by piercing through the interlayer dielectric film; forming a first wiring and a second wiring on the interlayer dielectric film, the first wiring electrically connecting the source side terminals of the memory cells and the source driver, and the second wiring being insulated from the first wiring and being electrically connected to the sense amplifier; forming a plurality of through holes piercing through the first wiring and the second wiring at a predetermined interval; and diffusing a foaming gas containing hydrogen to the memory cells via the through holes.

DETAILED DESCRIPTION OF THE INVENTION

Embodiments of the present invention will be explained below in detail with reference to the accompanying drawings. Note that the invention is not limited thereto.

Figure 1:
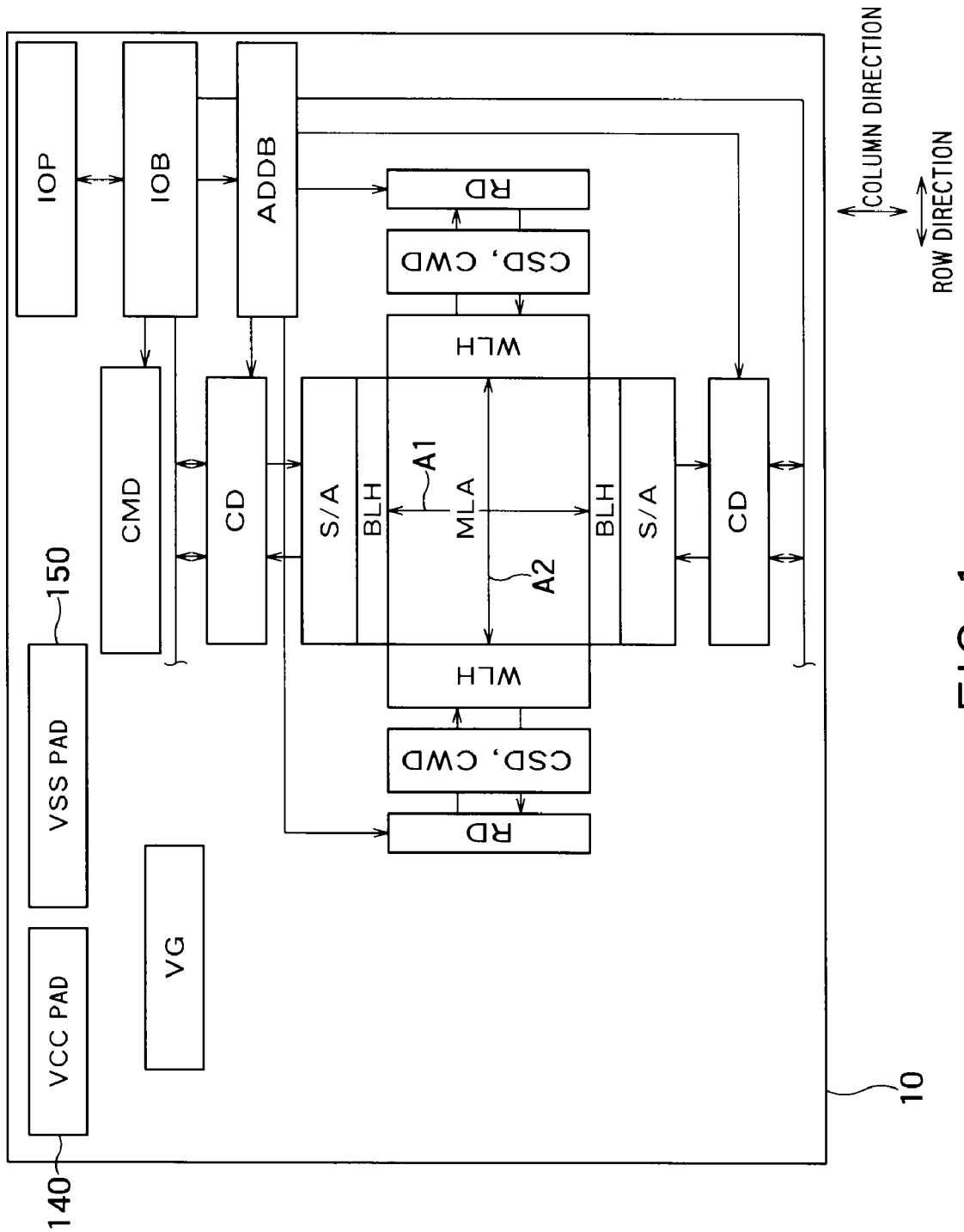
FIG. 1 is a block diagram showing an example of a configuration of a NAND flash memory 10 according to an embodiment of the present invention.

FIG. 1 is a block diagram showing an example of a configuration of a NAND flash memory 10 (hereinafter, simply "memory 10") according to an embodiment of the present invention. The memory 10 comprises a memory cell array MCA, row decoders RD, column decoders CD, sense amplifiers S/A, an input/output buffer IOB, a voltage generating circuit VG, cell source drivers CSD, an external I/O pad IOP, bit-line hookup BLH areas, word-line hookup WLH areas, a command decoder CMD, an address buffer ADDB, a VCC pad 140, and a VSS pad 150.

Data to be written to the memory 10, addresses, and commands are input to the input/output buffer IOB via the external I/O pad. Data read out from the memory 10 are output from the input/output buffer IOB via the external I/O pad. The input/output buffer IOB sends a command to the command decoder CMD, sends addresses to the row decoder RD and to the column decoder CD, and sends data to data latches within the sense amplifier S/A. The row decoder RD decodes an address, and selects a certain word line in a certain block based on an address signal. The column decoder CD decodes an address, selects sense amplifiers within the sense amplifier S/A based on an address signal, transfers read-out data latched by selected sense amplifiers to data buses, or transfers to-be-written data received from the outside to a selected sense amplifiers. The sense amplifier S/A is configured with plural sense amplifiers provided corresponding to each bit line. The sense amplifier S/A can have a known configuration.

At a data writing time, the sense amplifier S/A once latches data, and writes this data into memory cells connected to a selected word line via bit lines of a corresponding column. At a data reading time, the sense amplifier S/A detects data within the memory cells connected to the selected word line. The sense amplifier S/A outputs read data to the outside of the memory 10 via the input/output buffer IOB and the external I/O pad IOP. The sense amplifier S/A writes or reads data in a page unit.

Upon receiving voltage-generation-timing control signals and voltage-level setting signals, the voltage generating circuit VG generates internal voltages such as a reference voltage Vref for reference, an internal step-down power source voltage VDD, and a programming voltage Vpgm from a power source voltage VCC supplied from the outside. The voltage generating circuit VG supplies the internal voltages to the row decoder RD, the column decoder CD, the sense amplifier S/A, and the cell source driver CSD and so on.

The sense amplifier S/A detects data stored in memory cells MC or writes data into the memory cells MC via bit lines. Each sense amplifier has a latch function and is configured to be able to temporarily store read data or data to be written. The sense amplifier S/A is provided at both sides of the memory cell array MCA in a bit line extension direction among sides of the memory cell array MCA. For example, plural bit lines provided in the memory cell array MCA are connected to the sense amplifiers provided at one side and to the sense amplifiers provided at the other side, by a half number, respectively.

The cell source driver CSD is provided at the same side as that of the row decoder RD among the sides of the memory cell array MCA. The cell source driver CSD is electrically connected to a terminal at a source side of a NAND string configured by plural series-connected memory cells MC and two select gates SG connected to both sides of series-connected memory cells MC. Usually, the cell source driver CSD supplies a source potential common to all NAND strings. A cell well driver CWD supplies a cell well potential to a cell well in which NAND strings configured by memory cells are present.

The bit-line hookup BLH changes connection between the bit lines BL and the sense amplifiers via high breakdown-voltage transistors. The word-line hookup WLH changes connection between the word lines WL and the row decoder RD.

The VCC pad 140 is pads for supplying a power source potential from the outside. The VSS pad 150 supplies a ground potential from the outside.

Figure 2:
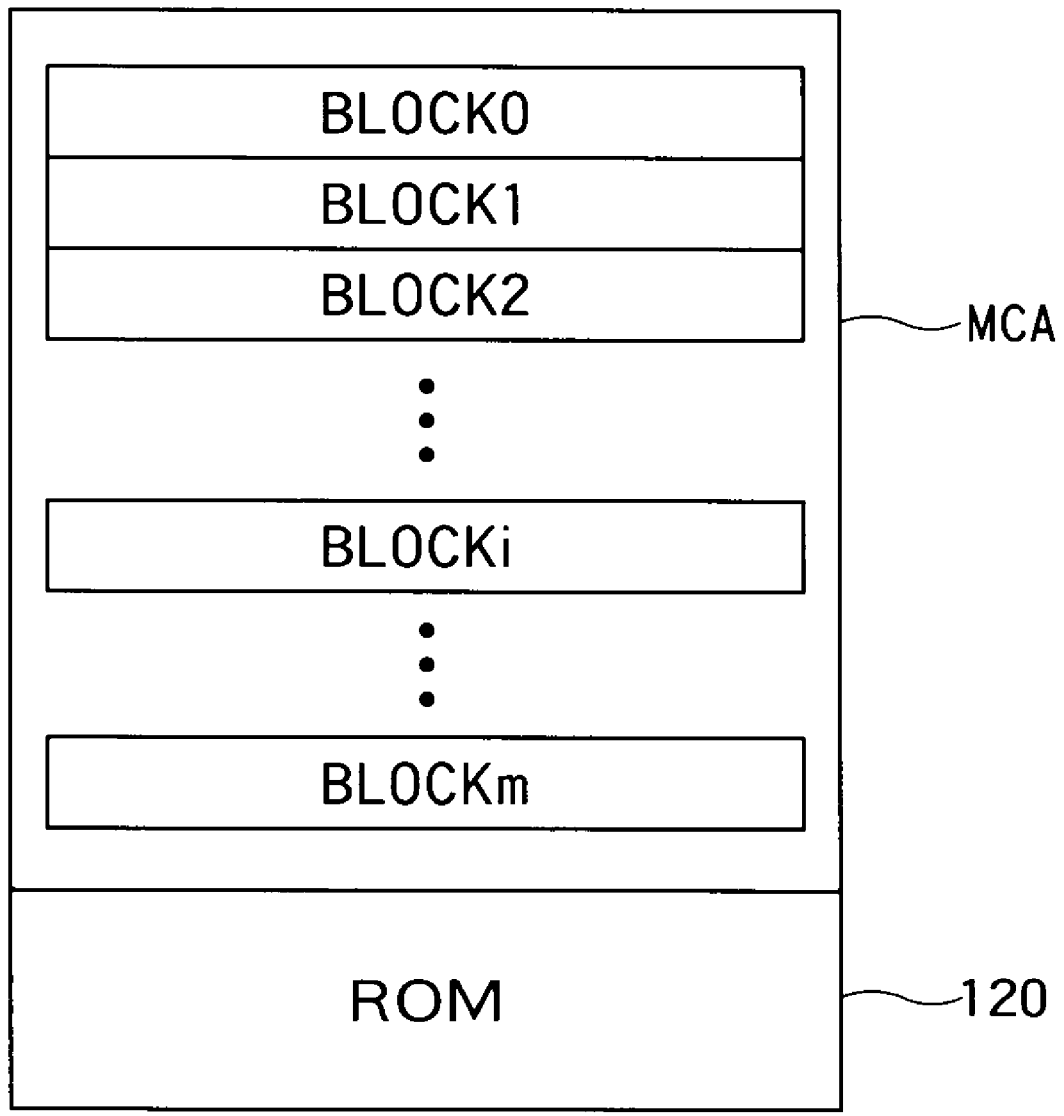
FIG. 2 shows an example of a configuration of the memory cell array MCA.

FIG. 2 shows an example of a configuration of the memory cell array MCA. The memory cell array MCA is divided into memory cell blocks (hereinafter, also "block") BLOCK0 to BLOCKm. In this example, the blocks BLOCK0 to BLOCKm are minimum units of data erasing, respectively. Each of the blocks BLOCK0 to BLOCKm is configured by plural pages. A page is a unit of data reading/data writing. Each page corresponds to the word line, and is configured by data of plural memory cells specified by a certain row address.

Figure 3:
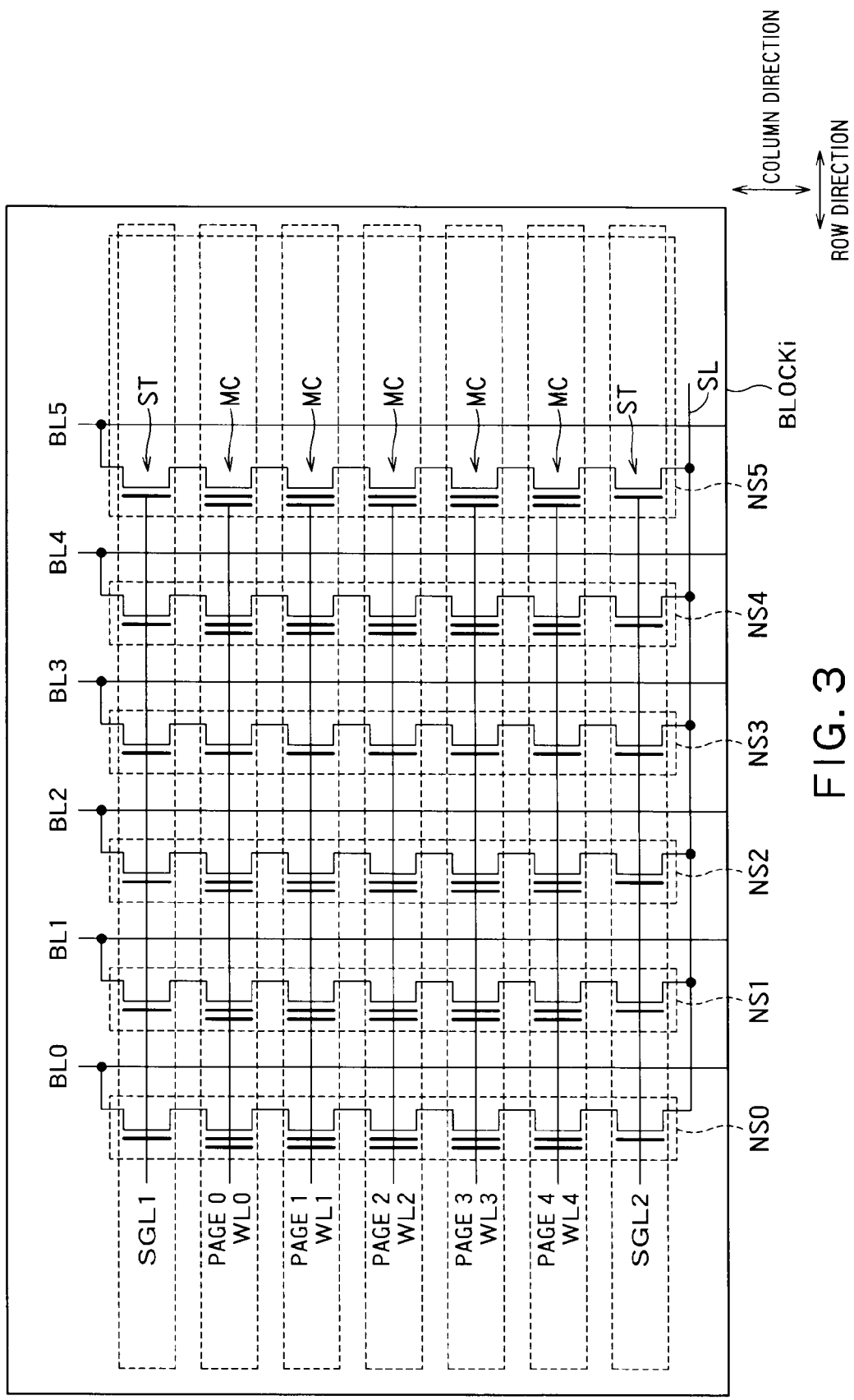
FIG. 3 shows an example of each configuration of the blocks BLOCK0 to BLOCKm.

FIG. 3 shows an example of each configuration of the blocks BLOCK0 to BLOCKm. A certain block BLOCKi (i=0 to m) comprises plural NAND strings NS each of which is connected to the bit line BL of each column. Each NAND string NS is formed by plural memory cells MC connected in series, and transistors of the select gate SG connected to both ends of the series-connected memory cells MC. While five memory cells MC are connected in this example, usually 32 or 64 memory cells MC are connected in series. One end of the NAND string NS is connected to a corresponding bit line BL, and the other end is connected to a common source line SL. A NAND string NSi (i=0 to 5) is connected to each corresponding bit line BLi (i=0 to 5).

A control gate of the memory cell MC is connected to the word line WL of the page to which the memory cell MC belongs. For example, a control gate of the memory cell MC belonging to a page i (i=0 to 4) is connected to a word line WLi (i=0 to 4). A gate of the selected transistor ST is connected to a select gate line SGL1 or SGL2.

Plural word lines WL are extended in a row direction, and plural bit lines BL are extended in a column direction substantially orthogonal with a row direction.

As shown in FIG. 3, the memory cells MC are provided corresponding to intersections of a lattice shape configured by the word lines WL and the bit lines BL. For example, intersections of a lattice shape configured by the word lines WL0 to WL4 and the bit lines BL0 to BL5 are positioned in a matrix shape of 5×6. The memory cells MC are two dimensionally arranged in a matrix shape of 5×6 corresponding to these intersections. While each block in the present embodiment comprises 5×6 (=30) memory cells MC, the number of the memory cells MC within one block is not limited thereto.

Each memory cell MC is configured by an n-type FET (Field-effect transistor) having a floating gate and a control gate. By giving a potential to the control gate through the word line, a charge (electron) is injected into the floating gate, or a charge (electron) is discharged from the floating gate. With this arrangement, data is written into the memory cell MC, or data is erased from the memory cell MC. Each memory cell MC has a threshold voltage corresponding to a number of charges (electrons) accumulated in the floating gate. Each memory cell MC can electrically store two-value data (one bit) or multiple-value data (two or more bits) as a difference of a threshold voltage.

The memory cell MC can be any type of charge-accumulated nonvolatile memory. Further, the memory cell MC can be any type of a memory element using a resistance change as information.

Figure 4:
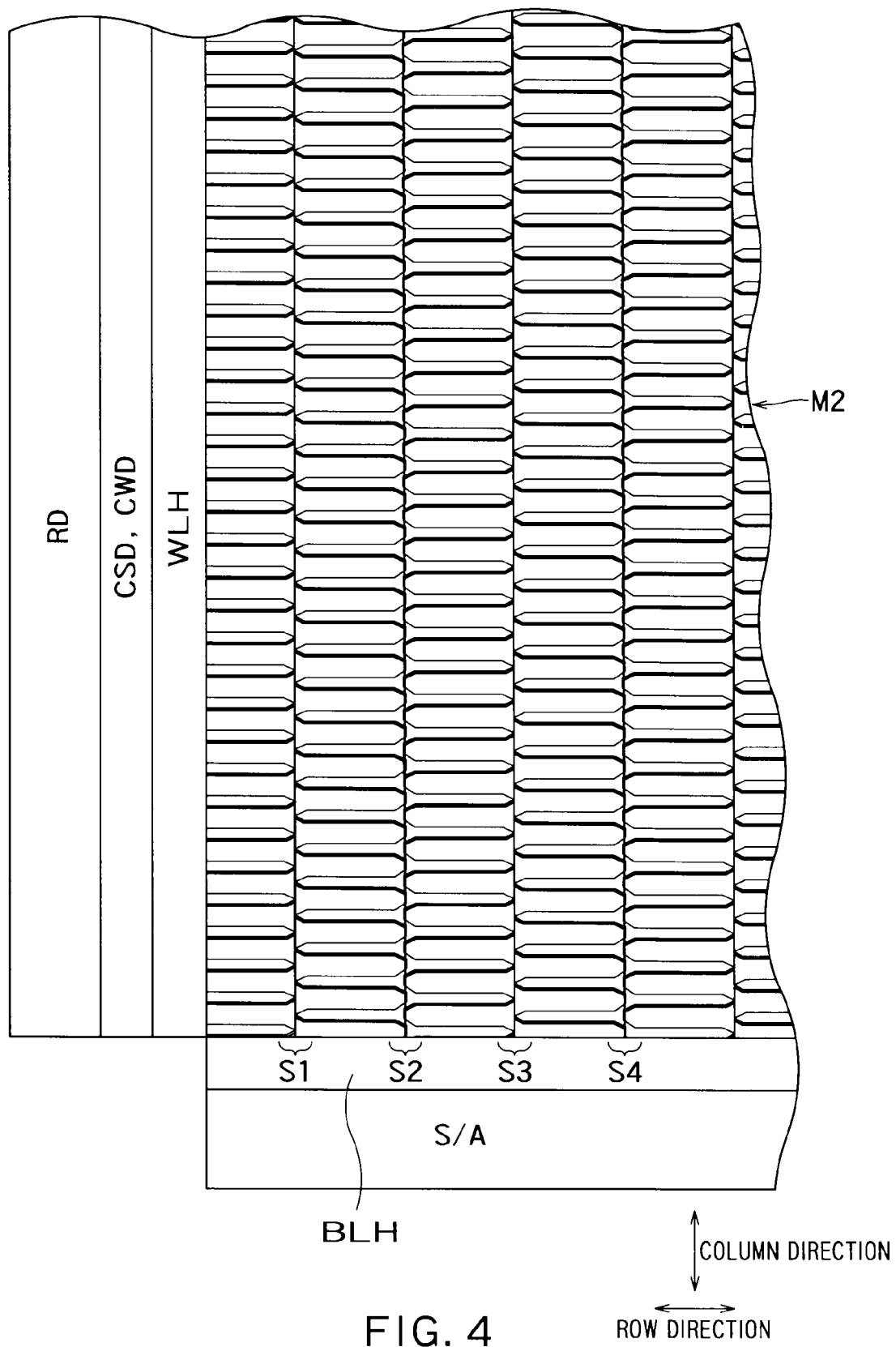
FIG. 4 is a schematic plan view showing a part of a top wiring layer M2 in a memory cell area and a part of a peripheral circuit thereof according to the present embodiment.
Figure 5:
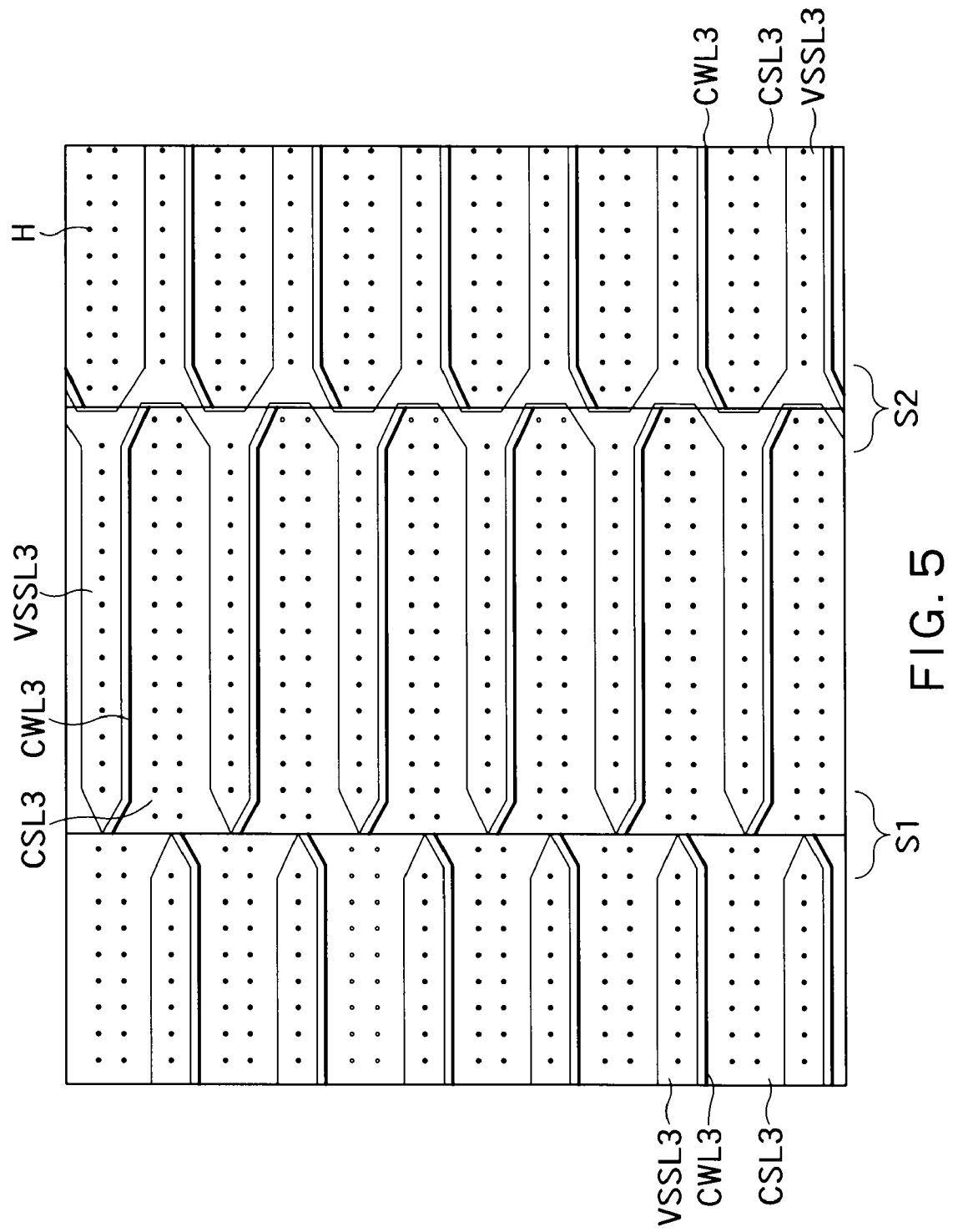
FIG. 5 is an enlarged plan view of the top wiring layer M2 in the memory cell area shown in FIG. 4.

FIG. 4 is a schematic plan view showing a part of a top wiring layer M2 in a memory cell area and a part of a peripheral circuit thereof according to the present embodiment. FIG. 5 is an enlarged plan view of the top wiring layer M2 in the memory cell area shown in FIG. 4. As shown in FIG. 5, in the top wiring layer M2, there are provided a cell source line CSL3 as a first wiring, a power source line VSSL3 as a second wiring, and a cell well line CWL3 which is electrically connected to a well area (see FIG. 8) formed on a semiconductor substrate. The cell source line CSL3, the power source line VSSL3, and the cell well line CWL3 are insulated by insulation films, respectively. The cell source line CSL3 and the cell well line CWL3 formed in the top wiring layer M2 are hereinafter called a third cell source line CSL3 and a third cell well line CWL3, respectively.

As shown in FIG. 4, the third cell source line CSL3 and the power source line VSSL3 are formed in a comb shape, respectively, and projected parts thereof are engaged with each other. Shunt regions S1 to S4 connect, via contacts, the third cell source line CSL3 and the third cell well line CWL3 to a second wiring layer M1 provided beneath the top wiring layer M2. The third cell well line CWL3 is formed at a portion between the third cell source line CSL3 and the power source line VSSL3.

Figure 6:
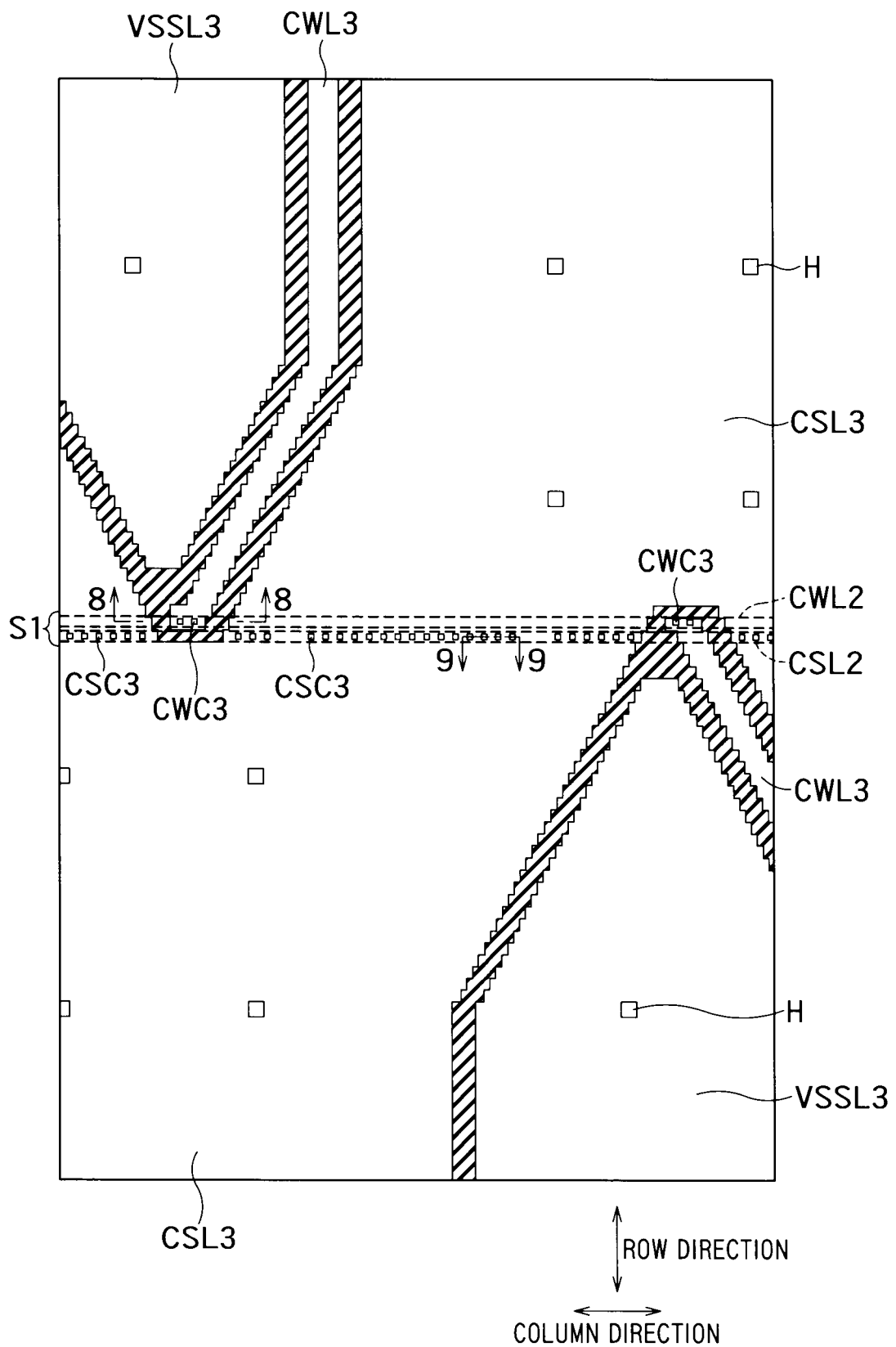
FIG. 6 and FIG. 7 are further enlarged plan views of the top wiring layer M2 in the memory cell area shown in FIG. 5.
Figure 7:
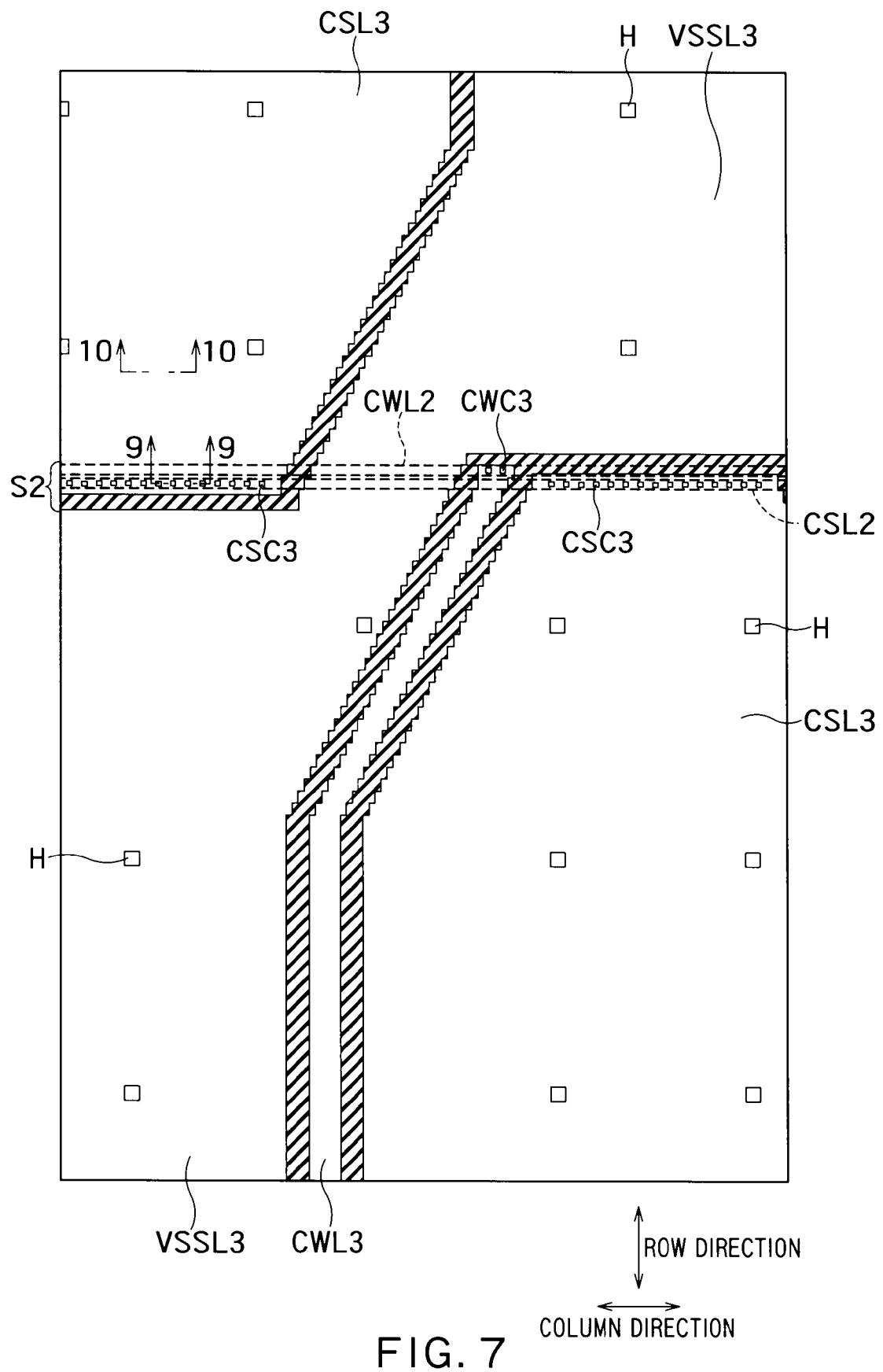

FIG. 6 and FIG. 7 are further enlarged plan views of the top wiring layer M2 in the memory cell area shown in FIG. 5. FIG. 6 shows a portion of the shunt region S1, and FIG. 7 shows a portion of the shunt region S2. A cell source line CSL2 and a cell well line CWL2 formed in the second wiring layer M1 are provided in the shunt regions S1 and S2 as shown by broken lines in FIGS. 6 and 7. The cell source line CSL2 and the cell well line CWL2 are provided by one, respectively in the shunt region S1, and are also provided by one, respectively in the shunt region S2. The cell source line CSL2 and the cell well line CWL2 are extended in a column direction in a similar manner to that of the bit lines, and are mutually insulated. The cell source line CSL2 and the cell well line CWL2 formed in the second wiring layer M1 are hereinafter called a second cell source line CSL2 and a second cell well line CWL2, respectively.

The second cell source line CSL2 is connected to the third cell source line CSL3 via a third cell source contact CSC3. The second cell well line CWL2 is connected to the third cell well line CWL3 via a third cell well contact CWC3.

Figure 8:
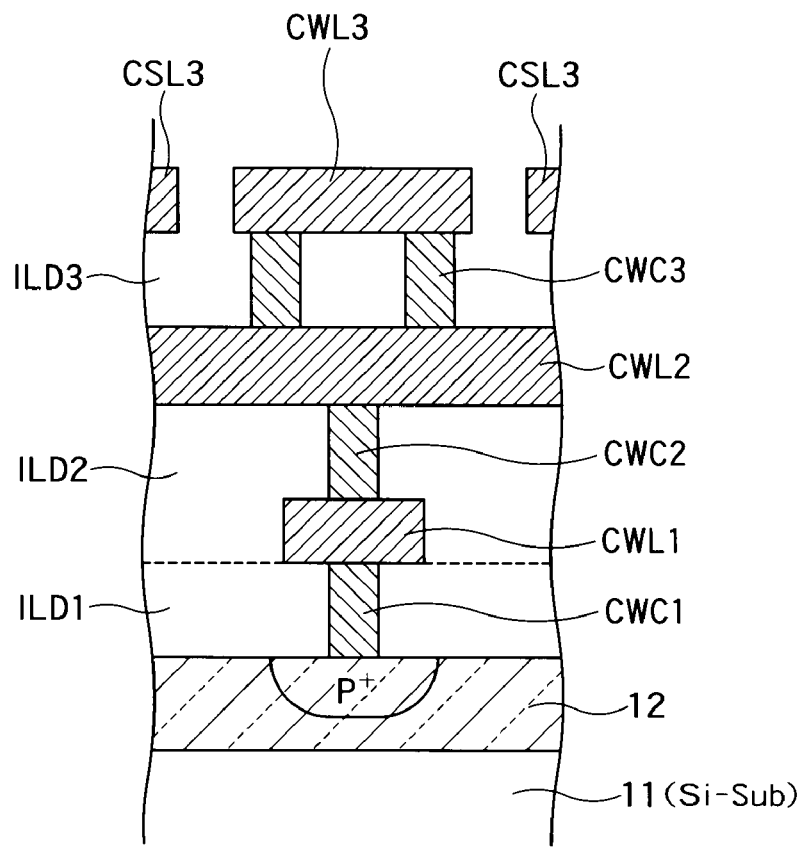
FIG. 8 is a cross-sectional view of portions of the second and third cell well lines CWL2 and CWL3.

FIG. 8 is a cross-sectional view of portions of the second and third cell well lines CWL2 and CWL3. FIG. 8 shows a cross section along a line 8-8 in FIG. 6. As shown in FIG. 8, a first wiring layer M0 is further provided beneath the second wiring layer M1. A cell well line formed in the first wiring layer M0 is called a first cell well line CWL1. The first cell well line CWL1 is connected to the second cell well line CWL2 via a second cell well contact CWC2. The first cell well line CWL1 is connected to a well area 12 formed on a semiconductor substrate 11 via a first cell well contact CWC1.

Figure 9:
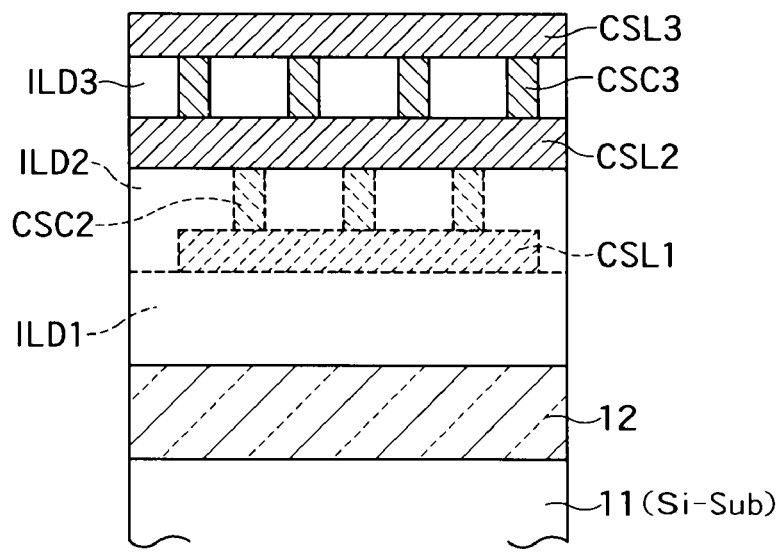
FIG. 9 is a cross-sectional view of portions of the second and third cell source lines CSL2 and CSL3.

FIG. 9 is a cross-sectional view of portions of the second and third cell source lines CSL2 and CSL3. FIG. 9 shows a cross section along a line 9-9 in FIGS. 6 and 7. A cell source line formed in the first wiring layer M0 is called a first cell source line CSL1. The first cell source line CSL1 is connected to the second cell source line CSL2 via a second cell source contact CSC2. The first cell source line CSL1 is connected to a source-side terminal of the NAND string NS formed on the semiconductor substrate 11, via a first cell source contact CSC1 not shown in FIG. 9. The third cell source line CSL3 is connected to the cell source driver CSD shown in FIG. 4. That is, the first to third cell source lines CSL1 to CSL3 are electrically connected between the source-side terminal of the NAND string NS and the cell source driver.

Figure 10:
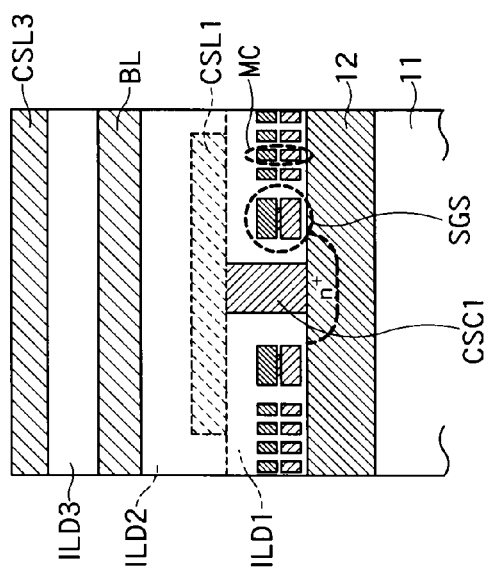
FIG. 10 is a cross-sectional view along a line 10-10 in FIG. 7.

FIG. 10 is a cross-sectional view along a line 10-10 in FIG. 7. The first cell source line CSL1 is connected to an n+diffusion layer at a source side of the NAND string NS via the first cell source contact CSC1.

Figure 11:
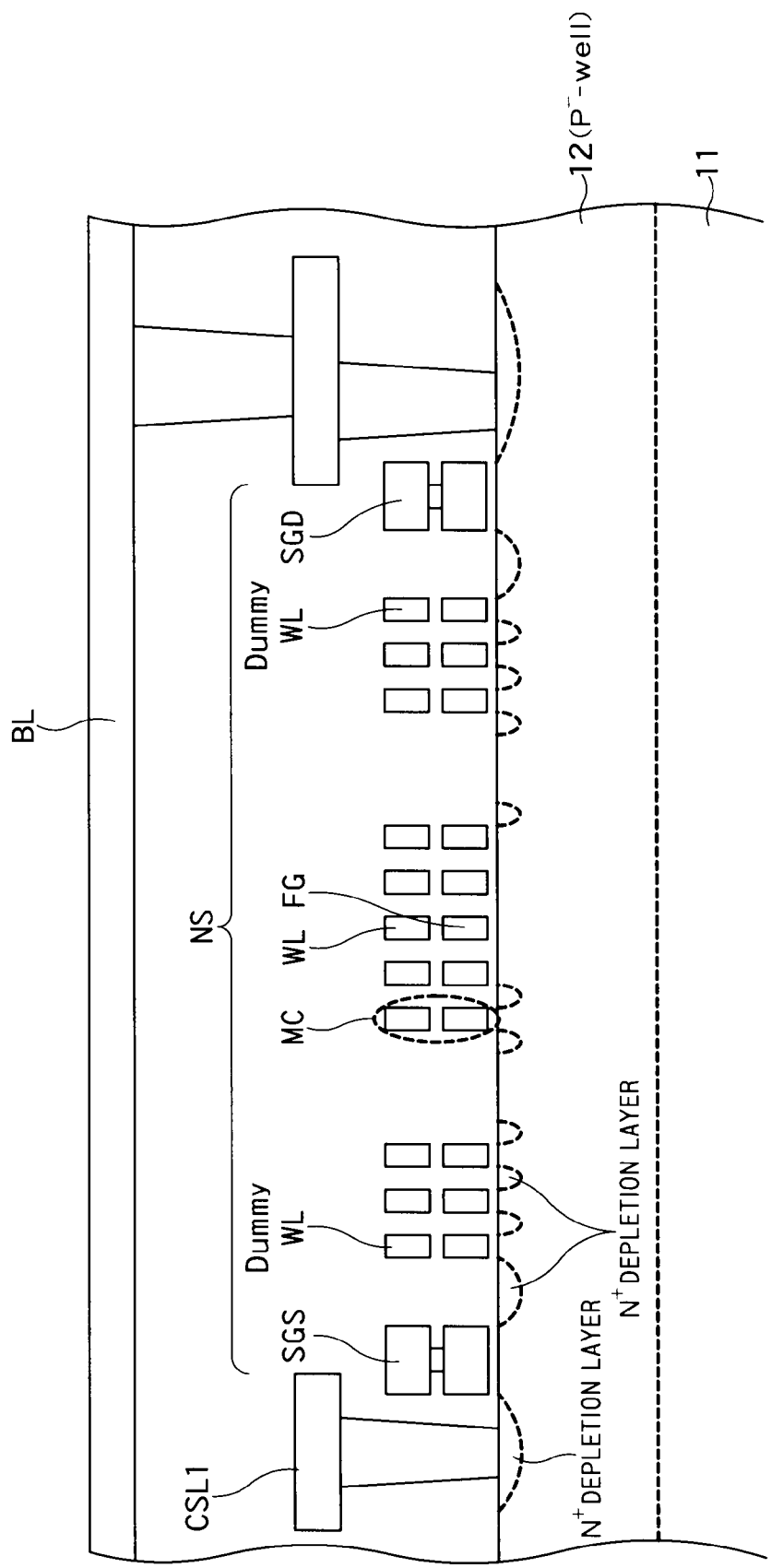
FIG. 11 is a cross-sectional view at a portion of the NAND string NS.

FIG. 11 is a cross-sectional view of the NAND string NS. The first cell source line CSL1 is connected to a source side of the NAND string NS, that is, a source-side select gate SGS. On the other hand, the bit line BL is connected to a drain side of the NAND string NS, that is, a drain-side select gate SGD. In FIG. 11, memory cells adjacent to the select gates SGS and SGD are dummy memory cells, and are not used to store actual data. Cells adjacent to the select gate are easily affected by write disturbance. Therefore, these cells are not usually used to store actual data in the NAND flash memories of downscaled generation.

As shown in FIG. 7, adjacent plural third cell source lines CSL3 are electrically connected in a row direction via the first and second cell source lines CSL1 and CSL2. With this arrangement, the first to third cell source lines CSL1 to CSL3 transmit a voltage in a row direction (a direction of an arrowhead A2 shown in FIG. 1) in low resistance.

The power source line VSSL3 is provided to transmit the ground potential VSS in low resistance to the sense amplifier S/A at a far side from external ground-potential terminals. The power source line VSSL3 electrically connects between ground potential VSS lines connected to sense amplifiers at both sides of the memory cell array MCA, in a state insulated from the first to third cell source lines CSL1 to CSL3 and the first to third cell well lines CWL1 to CWL3. That is, the power source line VSSL3 transmits a voltage in a column direction (a direction of an arrowhead A1 shown in FIG. 1).

In recent years, a pitch of the bit lines BL becomes small due to downscaling of memory chips. Along this reduction of the pitch, it has become difficult to secure room to pass a wiring other than wirings to change connection between the bit lines BL and the sense amplifiers via a high breakdown-voltage transistor in the bit-line hookup BLH area. That is, even when the cell source driver CSD and the cell well driver CWD are arranged between the sense amplifier S/A and the bit-line hookup BLH, there is little room to provide sufficiently in a low-resistance state outgoing lines to connect between the cell source driver CSD and the cell source line CSL3 and outgoing lines to connect between the cell well driver CWD and the well 12.

In the present embodiment, the cell source driver CSD and the cell well driver CWD are provided between the row decoder RD and the word-line hookup WLH area. The word-line hookup WLH area has room to provide outgoing lines to connect between the cell source driver CSD and the cell source line CSL. Therefore, the cell source driver CSD and the cell source line CSL3 can be connected in low resistance. On the other hand, the power source line VSSL3 is connected in low resistance to the ground potential VSS formed in the third wiring layer M2 in the sense amplifier S/A or the bit-line hookup BLH area.

In the present embodiment, the power source line VSSL3 is arranged to become in low resistance in a column direction (a direction of the arrowhead A1 shown in FIG. 1), and the third cell source line CSL3 is arranged to become in low resistance in a row direction (a direction of the arrowhead A2 shown in FIG. 1). Therefore, both supply of a ground potential to the sense amplifier S/A at a far side from the external groundpotential terminals and supply of a cell source potential to the memory cell MC can be achieved by using a low-resistance wiring route.

Referring back to FIGS. 6 and 7, plural through holes H are provided in the third cell source line CSL3 and the power source line VSSL3. The through holes H are provided to pass through the top wiring layer M2. The third cell source line CSL3 and the power source line VSSL3 are formed in as wide area as possible and on substantially the whole surface of the top wiring layer M2. Insulation films to mutually insulate the third cell source line CSL3, the power source line VSSL3, and the third cell well line CWL3 are formed in as narrow area as possible.

Usually, a semiconductor product is annealed by using a forming gas containing hydrogen, after forming the top wiring layer. By annealing in a state that hydrogen is spread to all effective memory cells MC, a data holding characteristic of the memory cells is improved.

When the wiring in the top wiring layer M2 covers substantially the whole surface of the memory cell array MCA (that is, when the wiring in the top layer is formed substantially without a gap), hydrogen in the foaming gas is not spread to a part of the memory cells MC, and the part of the memory cells has a risk of having poor data-holding characteristic.

In the present embodiment, the third cell source line CSL3 and the power source line VSSL3 are formed on substantially the whole surface of the top wiring layer M2. However, plural through holes H are provided at a predetermined interval in the third cell source line CSL3 and the power source line VSSL3. These through holes H are formed to pass hydrogen contained in the foaming gas and to spread the hydrogen to reach the whole memory cells MC at the annealing time. With this arrangement, all the memory cells MC can be hydrogenannealed, and the data holding characteristic of the whole memory cells MC can be improved.

While the interval between the through holes H is different depending on a process condition such as temperature and time at the annealing time, this interval can be determined based on a distance between a surface of the semiconductor substrate 11 and the top wiring layer M2. For example, when the distance between a surface of the semiconductor substrate 11 and the top wiring layer M2 is short, a diffusion distance of hydrogen can be short. Therefore, the interval between the through holes H can be relatively large. On the other hand, when the distance between the surface of the semiconductor substrate 11 and the top wiring layer M2 is large, a diffusion distance of hydrogen becomes long. Therefore, the interval between the through holes H needs to be relatively short.

A diameter of the through holes H can be F of the top wiring layer M2. F represents a minimum width processable by using lithography or etching. However, the through holes H are not particularly limited so long as hydrogen can pass through them.

The third cell well line CWL3 is formed in only a narrow area of the top wiring layer M2. Therefore, the through holes H can be either formed or not formed in the third cell well line CWL3.

In the present embodiment, the number of wiring layers is three including M0 to M2. However, the number of wiring layers can be equal to or smaller than two, or equal to or larger than four. Preferably, the through holes H are formed in the top wiring layer of a multilayer wiring structure. This is because usually the top wiring layer has lowest resistance and because this layer covers a relatively wide area to realize a low-resistance wiring layer. Further, to improve the data holding characteristic of the memory cells MC, hydrogen annealing is preferably performed after forming the top wiring layer. For example, when hydrogen annealing is performed before forming the top wiring layer, a characteristic of the memory cells MC has a risk of being degraded again by heat in a formation process of a wiring layer such as the top wiring layer. Therefore, usually, hydrogen annealing is performed after forming the top wiring layer.

A manufacturing method of the NAND flash memory according to the present embodiment is explained next. The memory cell array MCA and peripheral circuits thereof (the sense amplifiers S/A, the source driver CSD, or the like) are formed on the semiconductor substrate 11. The semiconductor substrate 11 is a silicon substrate, for example. A first interlayer dielectric film ILD1 is deposited to cover the memory cell array MCA and an upper part of the peripheral circuits thereof (see FIGS. 8 and 9).

Next, contact holes are formed on the first interlayer dielectric film ILD1 by using the lithography technique and the etching technique. A metal or polysilicon is embedded into the contact holes, thereby forming the first cell source contact CSC1 connected to the source of the memory cell MC and the first cell well contact CWC1 connected to the well area 12 (see FIGS. 8 and 10).

Next, the wiring layer M0 is deposited on the first interlayer dielectric film ILD1. The first wiring layer M0 is formed by using the lithography technique and the etching technique. With this arrangement, the first cell source line CSL1 electrically connected to the source of the memory cell MC and the first cell well line CWL1 electrically connected to the well area in which the memory cells MC are present are formed on the first interlayer dielectric film ILD1.

The contacts piercing through the first interlayer dielectric film ILD1 of the first cell source contact CSC1 and the first cell well contact CWC1 and the first wiring layer M0 can be formed by using what is called the dual damascene process. That is, trenches are first formed at a portion where the first wiring layer M0 is formed, then the contact holes are formed on the first interlayer dielectric film ILD1 by using the etching technique, and both can be formed by a process of collectively embedding by a metal.

Next, the second interlayer dielectric film ILD2 is deposited on the first cell source line CSL1 and the first cell well line CWL1 (see FIGS. 8 and 9). Contact holes are formed on the second interlayer dielectric film ILD2 by using the lithography technique and the etching technique. A metal is embedded into the contact holes, thereby forming the second cell source contact CSC2 connected to the first cell source line CSL1 and the second cell well contact CWC2 connected to the first cell well line CWL1 (see FIGS. 8 and 9).

The second wiring layer M1 is then deposited on the second interlayer dielectric film ILD2. The second wiring layer M1 is processed by using the lithography technique and the etching technique. With this arrangement, the second cell source line CSL2 connected to the second cell source contact CSC2 and the second cell well line CWL2 connected to the second cell well contact CWC2 are formed on the second interlayer dielectric film ILD2.

The second wiring layer M1 can be formed by using what is called the damascene process. That is, instead of processing the wiring by the etching technique after depositing a metal, trenches can be formed in the interlayer dielectric film by the etching technique, and the wiring can be formed by embedding the trenches with a metal.

Next, the third interlayer dielectric film ILD3 is deposited on the second cell source line CSL2 and the second cell well line CWL2. Contact holes are formed on the third interlayer dielectric film ILD3 by using the lithography technique and the etching technique. By embedding a metal into the contact holes, the third cell source contact CSC3 connected to the second cell source line CSL2 and the third cell well contact CWC3 connected to the second cell well line CWL2 are formed (see FIGS. 8 and 9). Usually, the contact holes are embedded with the same metal at the time of subsequent depositing of the third wiring layer M2.

The third wiring layer M2 is then deposited on the third interlayer dielectric film ILD3. The third wiring layer M2 is processed by using the lithography technique and the etching technique. With this arrangement, the third cell source line CSL3 connecting between the third cell source contact CSC3 and the cell source driver CSD and the third cell well line CWL3 connecting between the third cell well contact CWC3 and the cell well driver CWD are formed on the third interlayer dielectric film ILD3 (see FIGS. 8 and 9). At the same time, plural through holes H piercing through the third cell source line CSL3 are formed at a predetermined interval.

The first to third interlayer dielectric films ILD1 to ILD3 include a silicon oxide film such as PSG, BPSG or TEOS. The contacts CSC1 to CSC3, CWC1 to CWC3, and the wirings CSL1 to CSL3, and CWL1 to CWL3 include a metal such as tungsten, aluminum or copper.

Further, after an insulation film (an oxide film) that becomes a protection film is deposited on the third wiring layer, foaming-gas annealing is performed by using a foaming gas containing hydrogen. At this time, hydrogen reaches the plural memory cells via the plural through holes H.

As a result, the NAND flash memory according to the present embodiment is completed. According to the present embodiment, the through holes H pass the hydrogen contained in the foaming gas at the annealing time, and the hydrogen reaches all the memory cells MC. Consequently, a data holding characteristic of the memory cells MC can be improved.

Modification of Present Embodiment

Figure 12:
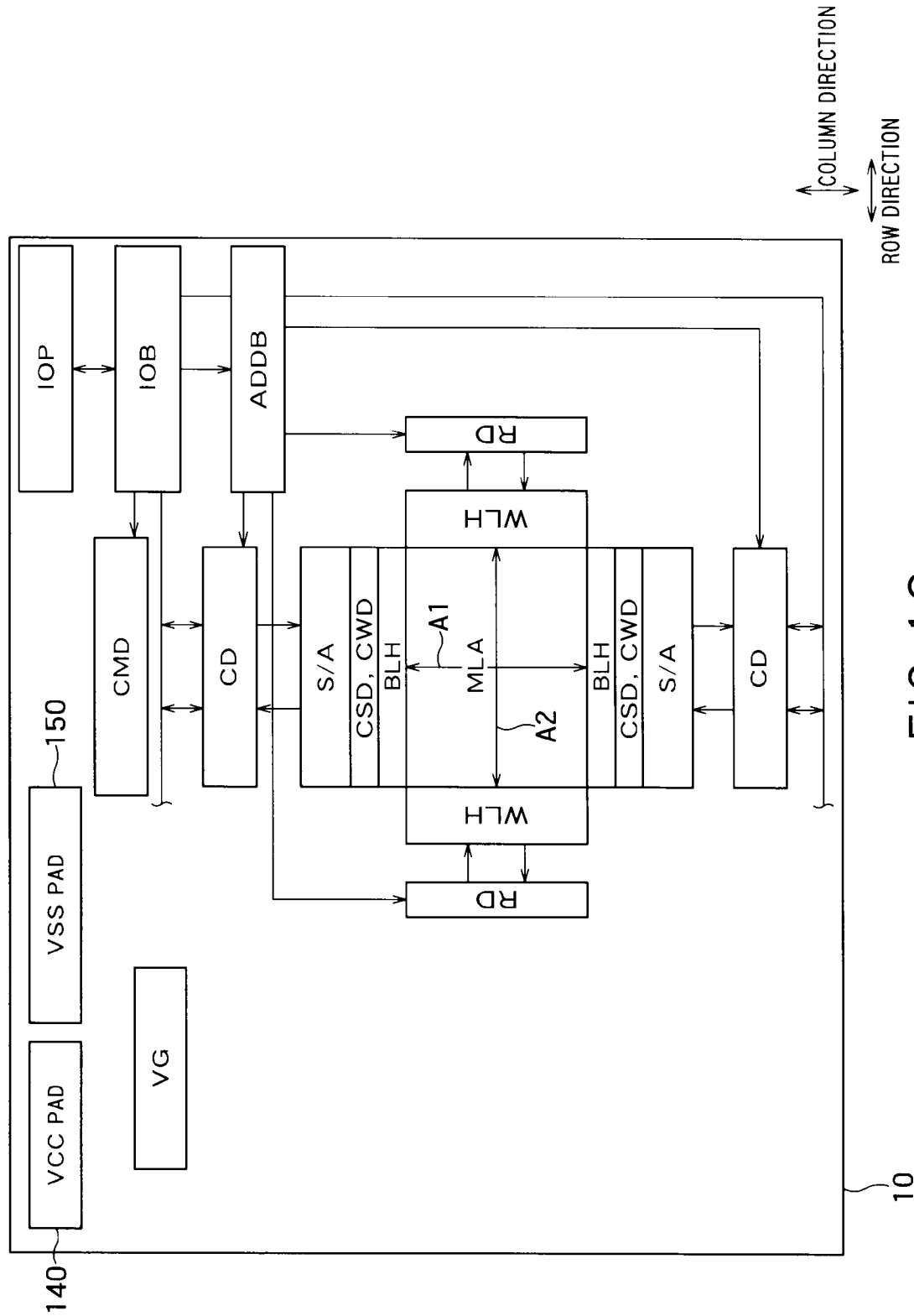
FIG. 12 is a block diagram showing an example of a configuration of the memory 10 according to a modification of the present embodiment.

FIG. 12 is a block diagram showing an example of a configuration of the memory 10 according to a modification of the present embodiment. In this modification, the cell source driver CSD and the cell well driver CWD are provided between the memory cell array MCA and the sense amplifier S/A in a similar manner to that disclosed in "Kanda et al. "A 120 mm² 16 Gb 4-MLC NAND Flash Memory with 43 nm CMOS Technology" ISSCC 2008/SESSION 23/NON-VOLATILE MEMORY/23.6 p.p. 430, 431 and 625".

In the present modification, low resistance directions of the third cell source line CSL3 and the power source line VSSL are in a column direction. The third cell source line CSL3 and the power source line VSSL3 are formed in as wide area as possible and on substantially the whole surface of the top wiring layer M2 to decrease their own resistances. Plural through holes H are provided in the third cell source line CSL3 and the power source line VSSL3. The through holes H are provided to pass through the top wiring layer M2. Insulation films to mutually insulate the third cell source line CSL3, the power source line VSSL3, and the third cell well line CWL3 are formed in as narrow area as possible.

When the wiring in the top wiring layer M2 covers substantially the whole surface of the memory cell array MCA (that is, when the wiring in the top layer is formed substantially without a gap), hydrogen in the foaming gas can not spread to a part of the memory cells MC, and the part of the memory cells has a risk of having poor data-holding characteristic.

In the present modification, the third cell source line CSL3 and the power source line VSSL3 are formed on substantially the whole surface of the top wiring layer M2. However, plural through holes H are provided at a predetermined interval in the third cell source line CSL3 and the power source line VSSL3. These through holes H are formed to pass hydrogen contained in the foaming gas and to spread the hydrogen so that the hydrogen can reach the whole memory cells MC at the annealing time. With this arrangement, all the memory cells MC can be hydrogen-annealed, and the data holding characteristic of the whole memory cells MC can be improved.

While the interval between the through holes H is different depending on a process condition such as temperature and time at the annealing time, this interval can be determined based on a distance between the surface of the semiconductor substrate 11 and the top wiring layer M2. For example, when the distance between a surface of the semiconductor substrate 11 and the top wiring layer M2 is short, a diffusion distance of hydrogen can be short. Therefore, the interval between the through holes H can be relatively large. On the other hand, when the distance between the surface of the semiconductor substrate 11 and the top wiring layer M2 is large, a diffusion distance of hydrogen becomes long. Therefore, the interval between the through holes H needs to be relatively short.

A diameter of the through holes H can be F of the top wiring layer M2. F represents a minimum width processable by using lithography or etching. However, the through holes H are not particularly limited so long as hydrogen can pass through them.

The third cell well line WCL3 is formed in only a narrow area of the top wiring layer M2. Therefore, the through holes H can be formed on the third cell well line WCL3, or they can be omitted.

In the present modification, the number of wiring layers is three including M0 to M2. However, the number of wiring layers can be equal to or smaller than two, or equal to or larger than four. However, preferably, the through holes H are formed in the top wiring layer of a multilayer wiring structure. This is because usually the top wiring layer has lowest resistance and because this layer covers a relatively wide area to realize a low-resistance wiring layer. Further, to improve the data holding characteristic of the memory cells MC, hydrogen annealing is preferably performed after forming the top wiring layer. For example, when hydrogen annealing is performed before forming the top wiring layer, a characteristic of the memory cells MC have a risk of being degraded again by heat in a formation process of a wiring layer such as the top wiring layer. Therefore, usually, hydrogen annealing is performed after forming the top wiring layer.

The present modification is effective when the pitch of the bit lines BL is not so small and also when there is room for passing a wiring other than wirings to change connection between the bit lines BL and the sense amplifiers in the bit-line hookup BLH area. The present modification is different from the above embodiment in this respect. However, the present modification can achieve the same effect of the above embodiment.

The invention claimed is:
1. A semiconductor memory device comprising:
a semiconductor substrate;
a memory cell array on the semiconductor substrate, the memory cell array comprising a plurality of memory cells capable of electrically storing data;
a sense amplifier configured to detect the data stored in at least one of the memory cells;

a cell source driver electrically connected to source side terminals of the memory cells and configured to supply a source potential to at least one of the source side terminals of the memory cells;

a first wiring configured to electrically connect between at least one of the source side terminals of the memory cells and the cell source driver; and a second wiring formed in a same wiring layer as the first wiring, the second wiring being insulated from the first wiring and being electrically connected to the sense amplifier, wherein the first wiring and the second wiring have a plurality of through holes provided at a predetermined interval.

2. The device according to claim 1, wherein the first wiring and the second wiring are formed in a top wiring layer of a multilayer wiring structure.

3. The device according to claim 2, wherein the through holes are provided at an interval determined based on a distance between the semiconductor substrate and a wiring layer of the first and the second wirings.

4. The device according to claim 2, wherein the through holes are provided in such a manner that hydrogen entered from the through holes reaches whole of the memory cells.

5. The device according to claim 2, wherein the first wiring is a source line supplying a source potential to the source side terminals of the memory cells, and the second wiring is a power source line supplying a ground potential or a power source potential to the sense amplifier.

6. The device according to claim 2, wherein the first wiring is a source line supplying a source potential to the source side terminals of the memory cells, and the second wiring is a power source line supplying a ground potential or a power source potential to the sense amplifier.

7. The device according to claim 6, wherein the through holes are provided so as to diffuse a foaming gas containing hydrogen to the memory cells via the through holes.

8. The device according to claim 1, wherein the through holes are provided at an interval determined based on a distance between the semiconductor substrate and a wiring layer of the first and the second wirings.

9. The device according to claim 8, wherein the first wiring is a source line supplying a source potential to the source side terminals of the memory cells, and the second wiring is a power source line supplying a ground potential or a power source potential to the sense amplifier.

10. The device according to claim 1, wherein the through holes are provided in such a manner that hydrogen entered from the through holes reaches whole of the memory cells.

11. The device according to claim 10, wherein the first wiring is a source line supplying a source potential to the source side terminals of the memory cells, and the second wiring is a power source line supplying a ground potential or a power source potential to the sense amplifier.

12. The device according to claim 1, wherein the first wiring is a source line supplying a source potential to the source side terminals of the memory cells, and the second wiring is a power source line supplying a ground potential or a power source potential to the sense amplifier.

13. The device according to claim 12, wherein a transmission direction of a potential of the first wiring is substantially orthogonal with a transmission direction of a potential of the second wiring.

14. The device according to claim 13, wherein the transmission direction of the potential of the first wiring is substantially same as an extension direction of word lines connected to the memory cells, and the transmission direction of the potential of the second wiring is substantially same as an extension direction of bit lines connected to the memory cells.

15. The device according to claim 14, wherein the through holes are provided so as to diffuse a foaming gas containing hydrogen to the memory cells via the through holes.

16. The device according to claim 1, wherein a transmission direction of a potential of the first wiring is substantially orthogonal with a transmission direction of a potential of the second wiring.

17. The device according to claim 16, wherein the transmission direction of the potential of the first wiring is substantially same as an extension direction of word lines connected to the memory cells, and the transmission direction of the potential of the second wiring is substantially same as an extension direction of bit lines connected to the memory cells.

18. The device according to claim 17, wherein the through holes are provided so as to diffuse a foaming gas containing hydrogen to the memory cells via the through holes.

19. The device according to claim 1, wherein the semiconductor memory device is a NAND-type flash memory.

20. The device according to claim 1, wherein the through holes are provided so as to diffuse a foaming gas containing hydrogen to the memory cells via the through holes.

21. The device according to claim 20, wherein the first wiring is a source line supplying a source potential to the source side terminals of the memory cells, and the second wiring is a power source line supplying a ground potential or a power source potential to the sense amplifier.

* * * * *